United States Patent
So et al.

(10) Patent No.: US 10,854,698 B2
(45) Date of Patent: Dec. 1, 2020

(54) DISPLAY SUBSTRATE AND ORGANIC LIGHT EMITTING DISPLAY DEVICE INCLUDING THE SAME

(71) Applicant: Samsung Display Co., LTD., Yongin-si (KR)

(72) Inventors: Dong-Yoon So, Asan-si (KR); Taegon Kim, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 117 days.

(21) Appl. No.: 16/052,616

(22) Filed: Aug. 2, 2018

(65) Prior Publication Data
US 2019/0103454 A1   Apr. 4, 2019

(30) Foreign Application Priority Data
Sep. 29, 2017   (KR) .................. 10-2017-0128142

(51) Int. Cl.
| | |
|---|---|
| *H01L 27/32* | (2006.01) |
| *G09G 3/3233* | (2016.01) |
| *G09G 3/3291* | (2016.01) |
| *G09G 3/3266* | (2016.01) |

(52) U.S. Cl.
CPC ....... *H01L 27/3276* (2013.01); *G09G 3/3233* (2013.01); *G09G 3/3266* (2013.01); *G09G 3/3291* (2013.01); *G09G 2300/0842* (2013.01); *G09G 2310/0251* (2013.01); *G09G 2310/0262* (2013.01); *G09G 2310/08* (2013.01); *H01L 2251/5392* (2013.01)

(58) Field of Classification Search
CPC .............. H01L 27/3276; G09G 3/3233; G09G 3/3258; G09G 2310/0262
See application file for complete search history.

(56) References Cited

U.S. PATENT DOCUMENTS

| | | | |
|---|---|---|---|
| 8,248,567 B2* | 8/2012 | Kawamura | G02F 1/1368 349/149 |
| 9,099,415 B2 | 8/2015 | Park | |
| 2003/0227579 A1 | 12/2003 | Nakahori et al. | |
| 2014/0117340 A1* | 5/2014 | Kim | H01L 29/78621 257/40 |
| 2014/0118232 A1* | 5/2014 | Kim | H01L 27/3262 345/82 |

(Continued)

FOREIGN PATENT DOCUMENTS

| | | |
|---|---|---|
| KR | 10-2003-0095216 | 12/2003 |
| KR | 10-2013-0100629 | 9/2013 |

*Primary Examiner* — Zandra V Smith
*Assistant Examiner* — Jeremy J Joy
(74) *Attorney, Agent, or Firm* — H.C. Park & Associates, PLC

(57) ABSTRACT

A display substrate includes a first conductive line extending along a first direction and a second conductive line partially overlapping the first conductive line with a first insulation layer in between. The second conductive line includes a first substantially linear portion and a second substantially linear portion extending along the first direction, and an angled portion disposed between the first substantially linear portion and the second substantially linear portion. At least one side surface of the angled portion extends along a second direction intersecting the first direction.

19 Claims, 7 Drawing Sheets

(56) References Cited

U.S. PATENT DOCUMENTS

| | | | |
|---|---|---|---|
| 2015/0015468 A1* | 1/2015 | Ko | G09G 3/3233 |
| | | | 345/82 |
| 2016/0035805 A1* | 2/2016 | Kim | H01L 27/3276 |
| | | | 345/76 |
| 2016/0181341 A1* | 6/2016 | Lee | H01L 27/1255 |
| | | | 257/40 |
| 2016/0217746 A1* | 7/2016 | An | H01L 27/3262 |
| 2016/0284267 A1* | 9/2016 | Gil | H01L 27/3265 |
| 2016/0300834 A1* | 10/2016 | Yu | H01L 27/0288 |
| 2016/0322443 A1* | 11/2016 | Her | G09G 3/3233 |
| 2017/0236892 A1* | 8/2017 | Park | H01L 27/3276 |
| | | | 257/40 |
| 2017/0301739 A1* | 10/2017 | Park | H01L 27/3251 |

* cited by examiner

DISPLAY SUBSTRATE AND ORGANIC LIGHT EMITTING DISPLAY DEVICE INCLUDING THE SAME

CROSS REFERENCE TO RELATED APPLICATION

This application claims priority from and the benefit of Korean Patent Application No. 10-2017-0128142, filed on Sep. 29, 2017, which is hereby incorporated by reference for all purposes as if fully set forth herein.

BACKGROUND

Field

Exemplary embodiments of the invention relate generally to display devices and, more specifically, to display substrates including conductive lines and organic light emitting display devices including the display substrates.

Discussion of the Background

An organic light emitting display device has an organic light emitting diode (OLED) whose luminance may be controlled by a current or voltage applied thereto. Since the organic light emitting display device is suitable for use in a high contrast and rapid response device, it has been used in mobile devices, smartphones, laptop computers, digital broadcasting terminals, personal digital assistants (PDAs), portable multimedia players (PMPs), navigations, slate computers, tablet computers, ultrabooks, wearable devices, digital TVs, desktop computers, digital signage, and the like.

An organic light emitting display device may include a plurality of gate lines, a plurality of data lines, a plurality of power lines, and a plurality of pixel circuits connected to the gate, data, and power lines. Each pixel circuit may typically include an organic light emitting diode, transistors including a switching transistor transmitting a data signal and a driving transistor driving the organic light emitting diode according to the data signal, and a capacitor maintaining a data voltage of the data signal.

The above information disclosed in this Background section is only for understanding of the background of the inventive concepts, and, therefore, it may contain information that does not constitute prior art.

SUMMARY

Display substrates constructed according to exemplary implementations of the invention avoid formation of a residual conductive layer during manufacture of the substrate.

For example, organic light emitting display devices constructed according to exemplary implementations of the invention avoid formation of a residual conductive between a data line and a power line during an etching process for forming the data line and the power line.

Additional features of the inventive concepts will be set forth in the description which follows, and in part will be apparent from the description, or may be learned by practice of the inventive concepts.

According to one or more exemplary embodiments of the invention, a display substrate may include a first conductive line extending along a first direction and a second conductive line partially overlapping the first conductive line with a first insulation layer in between. The second conductive line may include a first substantially linear portion and a second substantially linear portion extending along the first direction and an angled portion between the first substantially linear portion and the second substantially linear portion, at least one side surface of the angled portion extending along a second direction that may intersect the first direction.

In an exemplary embodiment, the at least one side surface of the angled portion may intersect a side surface of the first conductive line.

In an exemplary embodiment, the angled portion may have opposing side surfaces that may extend along the second direction.

In an exemplary embodiment, the angled portion may have opposing side surfaces, with one of the opposing side surfaces of the angled portion may extend along the second direction, and another of opposing side surfaces of the angled portion may extend along a third direction different from the first and second directions.

In an exemplary embodiment, the angled portion may have opposing side surfaces, with one of the opposing side surfaces of the angled portion may extend along the second direction, and another of the opposing side surfaces of the angled portion may extend along the first direction.

In an exemplary embodiment, the first and second conductive lines may each have side surfaces, and a first horizontal distance between a side surface of the first conductive line and a side surface of the first substantially linear portion of the second conductive line may be greater than about 0.45 μm.

In an exemplary embodiment, the first horizontal distance may be greater than about 1.48 μm.

In an exemplary embodiment, a second horizontal distance between a side surface of the first conductive line and a side surface of the second substantially linear portion of the second conductive line may be greater than about 0.45 μm.

In an exemplary embodiment, the second horizontal distance may be greater than about 1.48 μm.

In an exemplary embodiment, the display substrate may further include a third conductive line and a fourth conductive line each intersecting the second conductive line with a second insulation layer in between. The angled portion of the second conductive line may be disposed between the third conductive line and the fourth conductive line.

According to yet another exemplary embodiment of the invention, an organic light emitting display device may include an active pattern comprising an active line extending along a first direction, a signal line comprising an initialization voltage line partially overlapping the active line with a gate insulation layer in between, a gate line and an initialization line extending along the first direction, and a data line and a power line extending along a second direction intersecting the first direction, and a plurality of pixels each connected to the signal line, the plurality of pixels each comprising a plurality of thin film transistors formed along the active pattern, a capacitor connected to the power line, and an organic light emitting diode. The initialization voltage line may include a first substantially linear portion and a second substantially linear portion extending along the first direction and an angled portion between the first substantially linear portion and the second substantially linear portion, the angled portion may have at least one side surface extending along a third direction different from the first and second directions.

In an exemplary embodiment, the at least one side surface of the angled portion may intersect a side surface of the active line.

In an exemplary embodiment, the angled portion may have opposing side surfaces that may extend along the third direction.

In an exemplary embodiment, the angled portion may have opposing side surfaces, with one of the opposing side surfaces may extend along the third direction, and another of the opposing side surfaces may extend along a fourth direction.

In an exemplary embodiment, the angled portion may have opposing side surfaces, with one of the opposing side surfaces may extend along the third direction, and another of the opposing side surfaces may extend along the first direction.

In an exemplary embodiment, each of the plurality of pixels may include a switching thin film transistor connected to the gate line and the data line, a driving thin film transistor connected to a drain of the switching thin film transistor, an initialization thin film transistor turned-on by an initialization signal transmitted through the initialization line to apply an initialization voltage transmitted through the initialization voltage line, and a bypass thin film transistor connected to an anode of the organic light emitting diode. The active line may be between the bypass thin film transistor of a pixel in an i-th row and the initialization thin film transistor of a pixel in an (i+1)-th row, i may be a natural number.

In an exemplary embodiment, the active line may be between the bypass thin film transistor of a pixel in a j-th column and the initialization thin film transistor of a pixel in a (j+1)-th column, j may be a natural number.

In an exemplary embodiment, the data line and the power line may intersect the initialization voltage line, respectively, with an insulation interlayer in between, and the angled portion of the initialization voltage line may be between the data line and the power line.

In an exemplary embodiment, the power line may be connected to the capacitor of a pixel in a j-th column, and the data line may be connected to the switching thin film transistor of a pixel in a (j+1)-th column.

In an exemplary embodiment, the gate insulation layer may include a first gate insulation layer and a second gate insulation layer. The gate line and the initialization line may be on the active pattern with the first gate insulation layer in between. The initialization voltage line may be on the gate line and the initialization line with the second gate insulation layer in between.

In the display substrate according to the exemplary embodiments, the second conductive line, which overlaps the first conductive line extending along the first direction, may include the angled portion having at least one side surface extending along the second direction. Accordingly, the formation of the unwanted residual conductive layer on the second conductive line may be prevented.

In the organic light emitting display device according to the exemplary embodiments, the initialization voltage line, which overlaps the active line extending along the first direction, may include the angle portion having at least one side surface extending along the second direction. Accordingly, the formation of the unwanted residual conductive layer on the initialization voltage line may be prevented.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
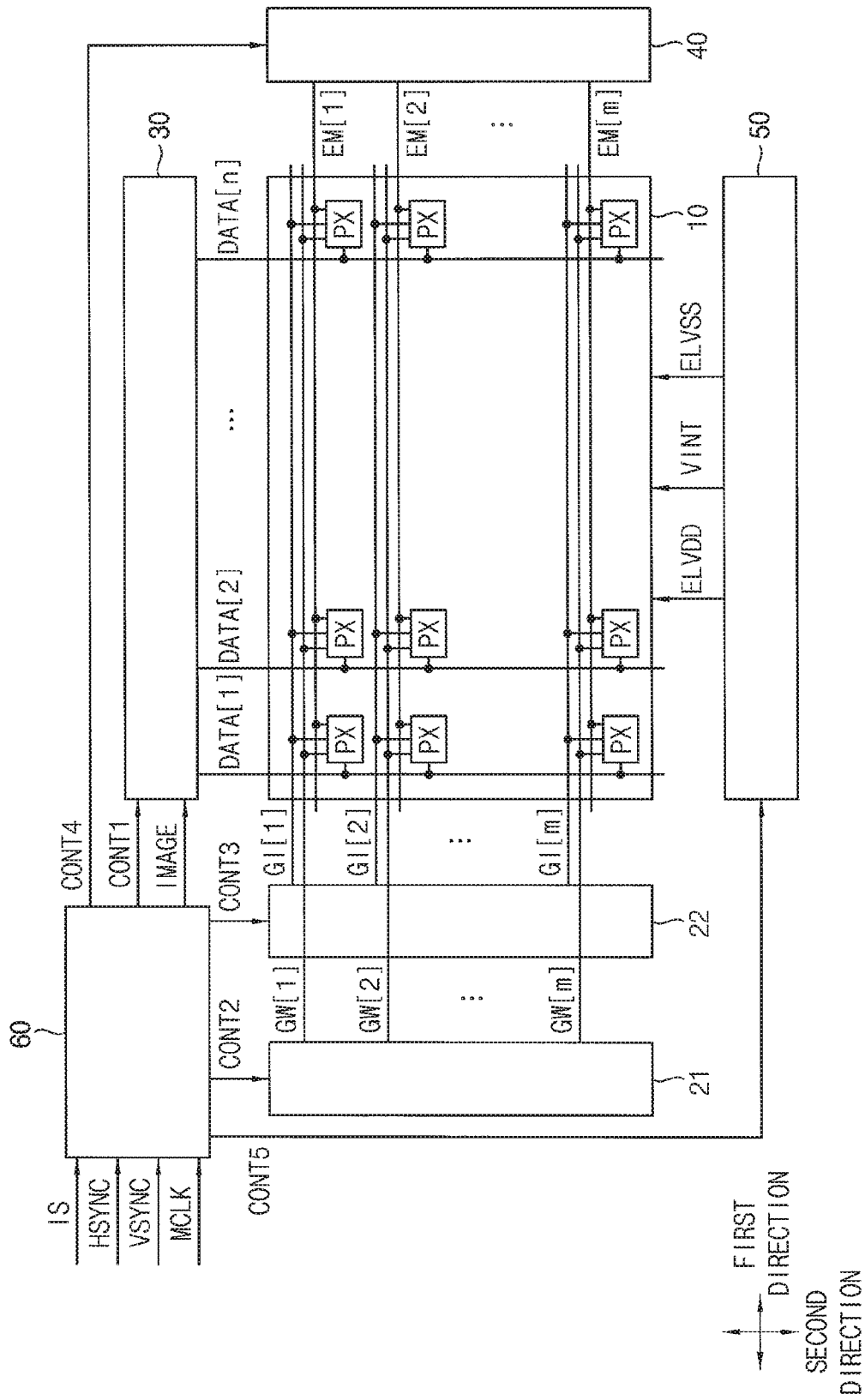
FIG. 1 is a block diagram illustrating an organic light emitting display device constructed according to an exemplary embodiment of the invention.

In the following description, for the purposes of explanation, numerous specific details are set forth in order to provide a thorough understanding of various exemplary embodiments or implementations of implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalties between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, display substrates and organic light emitting display devices constructed in accordance with the principles and exemplary embodiments of the invention will be explained in detail with reference to the accompanying drawings.

FIG. 1 is a block diagram illustrating an organic light emitting display device constructed according to an exemplary embodiment of the invention.

Referring to FIG. 1, an organic light emitting display device may include a display unit 10, a gate driver 21, an initialization driver 22, a data driver 30, a light emission driver 40, a power supply 50, and a signal controller 60. The organic light emitting display device described herein may include a larger or smaller number of components than those described above.

The display unit 10 may include a plurality of pixels PX that are connected to corresponding gate lines among a plurality of gate lines, corresponding initialization lines among a plurality of initialization lines, corresponding data lines among a plurality of data lines, and corresponding light emission control lines among a plurality of light emission control lines. The pixels PX may display an image according to data voltages transmitted from the data lines.

The pixels PX may be respectively connected to the gate lines, the initialization lines, the data lines, and the light emission control lines to be approximately arranged in a matrix form. In an exemplary embodiment, the pixels PX may have a matrix structure of m-rows and n-columns (Here, m and n are natural numbers).

The gate lines may extend along a first direction (e.g., a row direction) to be substantially parallel to each other. The initialization lines and the light emission control lines may extend along the first direction to be substantially parallel to each other. The data lines may extend along a second direction (e.g., a column direction) that intersects the first direction to be substantially parallel to each other.

The gate driver 21 may be connected to the display unit 10 through the gate lines. The gate driver 21 may generate a plurality of gate signals GW[1], GW[2], . . . , GW[m] according to a control signal CONT2 and then may transmit the generated gate signals to corresponding gate lines among the gate lines.

The initialization driver 22 may be connected to the display unit 10 through the initialization lines. The initialization driver 22 may generate a plurality of initialization signals GI[1], GI[2], . . . , GI[m] according to a control signal CONT3 and then may transmit the generated initialization signals to corresponding initialization lines among the initialization lines.

The control signals CONT2 and CONT3 may be operating control signals generated by the signal controller 60 and respectively transmitted to the gate driver 21 and the initialization driver 22. Each of the control signals CONT2 and CONT3 may include a gate start signal and different types of clock signals. The gate start signal may generate a first gate signal GW[1] for displaying an image of one frame. One of the clock signals may be a synchronization signal for sequentially applying the gate signals GW[1], GW[2], . . . , GW[m] to the gate lines, and another of the clock signals may be a synchronization signal for substantially simultaneously (or concurrently) applying the initialization signals GI[1], GI[2], . . . , GI[m] to the initialization lines.

The data driver 30 may be connected to the pixels PX through the data lines. The data driver 30 may receive an image data signal IMAGE and may transmit data signals DATA[1], DATA[2], . . . , DATA[n] to corresponding data lines among the data lines according to a control signal CONT1. The control signal CONT1 may be an operating control signal generated by the signal controller 60 and transmitted to the data driver 30.

The data driver 30 may select a gray voltage according to the image data signal IMAGE and may transmit the selected gray voltage as the data signals DATA[1], DATA[2], . . . , DATA[n] to the data lines. The data driver 30 may sample and hold the image data signal IMAGE inputted according to the control signal CONT1, and may respectively transmit the data signals DATA[1], DATA[2], . . . , DATA[n] to the data lines. For example, the data driver 30 may apply the data signals DATA[1], DATA[2], . . . , DATA[n] having a predetermined voltage range to the data lines depending on the gate signals GW[1], GW[2], . . . , GW[m] of a gate-on voltage.

The light emission driver 40 may generate a plurality of light emission control signals EM[1], EM[2], . . . , EM[m] according to a control signal CONT4. The light emission driver 40 may respectively transmit the light emission control signals EM[1], EM[2], . . . , EM[m] to the light emission control lines according to the control signal CONT4.

The power supply 50 may apply an initialization voltage VINT, a first driving voltage ELVDD, and a second driving voltage ELVSS to the pixels PX of the display unit 10 according to a control signal CONT5.

The signal controller 60 may receive an image signal IS inputted from the outside and input control signals controlling the image signal IS. The image signal IS may include luminance information that is differentiated based on gray in each pixel PX of the display unit 10. Meanwhile, the input control signals transmitted to the signal controller 60 may include a horizontal synchronization signal HSYNC, a vertical synchronization signal VSYNC, a main clock signal MCLK, or the like.

The signal controller 60 may generate the control signals CONT1, CONT2, CONT3, CONT4, and CONT5 and the image data signal IMAGE according to the image signal IS, the horizontal synchronization signal HSYNC, the vertical synchronization signal VSYNC, and the main clock signal MCLK. The signal controller 60 may process the image signal IS according to the operating conditions of the display unit 10 and the data driver 30 based on the inputted image signal IS and the input control signals. For example, the signal controller 60 may generate the image data signal IMAGE by applying image processes such as gamma correction, luminance compensation, and the like to the image signal IS.

For example, the signal controller 60 may generate the control signal CONT1 that controls operation of the data driver 30, and may transmit the generated control signal CONT1 along with the image data signal IMAGE processed by the image processes to the data driver 30. Further, the signal controller 60 may transmit the control signal CONT2 that controls operation of the gate driver 21 to the gate driver 21. Further, the signal controller 60 may transmit the control signal CONT3 that controls operation of the initialization driver 22 to the initialization driver 22. Further, the signal controller 60 may transmit the control signal CONT4 to the light emission driver 40 to drive the light emission driver 40.

In addition, the signal controller 60 may control the power supply 50. The power supply 50 may supply the initialization voltage VINT that initializes a gate of a driving transistor and an anode of an organic light emitting diode included in each pixel PX of the display unit 10 with a predetermined voltage, and may supply the driving voltages ELVDD and ELVSS for driving each pixel PX. For example, the signal controller 60 may transmit the control signal CONT5 to the power supply 50 to drive the power supply 50.

Next, a pixel of an organic light emitting display device according to an exemplary embodiment will be described in detail with reference to FIG. 2.

Figure 2:
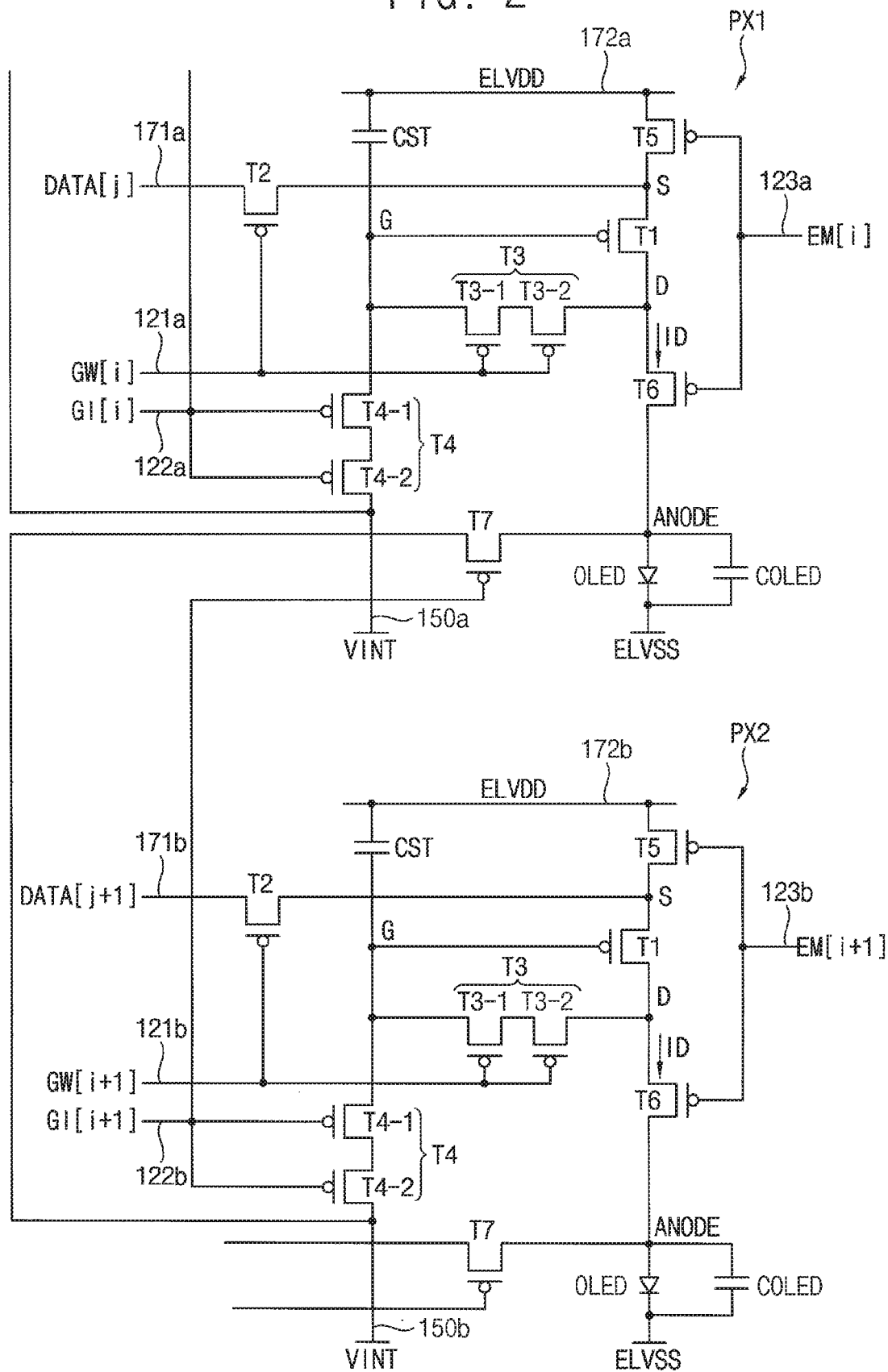
FIG. 2 is an equivalent circuit diagram illustrating an exemplary embodiment of pixels that may be used in the organic light emitting display device shown in FIG. 1.

FIG. 2 is an equivalent circuit diagram illustrating an exemplary embodiment of pixels that may be used in the organic light emitting display device shown in FIG. 1.

Referring to FIG. 2, two adjacent pixels PX1 and PX2 of an organic light emitting display device according to an exemplary embodiment may include a plurality of signal lines 121a, 121b, 122a, 122b, 123a, 123b, 150a, 150b, 171a, 171b, 172a, and 172b, a plurality of thin film transistors T1, T2, T3, T4, T5, T6, and T7 connected to the signal lines, a storage capacitor CST, and an organic light emitting diode OLED. In an exemplary embodiment, a first pixel PX1 may be a pixel located in an i-th row, and a second pixel PX2 may be a pixel located in an (i+1)-th row (Here, i is a natural number and less than m). In an exemplary embodiment, the first pixel PX1 may be a pixel located in a j-th column, and the second pixel PX2 may be a pixel located in a (j+1)-th column (Here, j is a natural number and less than n). For example, the first pixel PX1 may be a pixel located in the i-th row and the j-th column, and the second pixel PX2 may be a pixel located in the (i+1)-th row and the (j+1)-th column.

The thin film transistors T1, T2, T3, T4, T5, T6, and T7 may include a driving thin film transistor T1, a switching thin film transistor T2, a compensation thin film transistor T3, an initialization thin film transistor T4, an operation control thin film transistor T5, a light emission control thin film transistor T6, and a bypass thin film transistor T7.

The signal lines 121a, 121b, 122a, 122b, 123a, 123b, 150a, 150b, 171a, 171b, 172a, and 172b may include gate lines 121a and 121b transmitting the gate signals GW[i] and GW[i+1], initialization lines 122a and 122b transmitting the initialization signals GI[i] and GI[i+1] to the initialization thin film transistor T4 and the bypass thin film transistor T7, light emission control lines 123a and 123b transmitting the light emission control signals EM[i] and EM[i+1] to the operation control thin film transistor T5 and the light emission control thin film transistor T6, initialization voltage lines 150a and 150b transmitting the initialization voltage VINT that initializes the driving thin film transistor T1 and the organic light emitting diode OLED, data lines 171a and 171b intersecting the gate lines 121a and 121b and transmitting the data signals DATA[j] and DATA[j+1], and power lines 172a and 172b transmitting the first driving voltage ELVDD and formed to be substantially parallel to the data lines 171a and 171b.

In the first pixel PX1 located in an i-th row, a gate G of the driving thin film transistor T1 may be connected to one end of the storage capacitor CST, and a source S of the driving thin film transistor T1 may be connected to the power line 172a via the operation control thin film transistor T5. A drain D of the driving thin film transistor T1 may be electrically connected to an anode of the organic light emitting diode OLED via the light emission control thin film transistor T6. The driving thin film transistor T1 may receive the data signal DATA[j] according to a switching operation of the switching thin film transistor T2 to supply a driving current ID to the organic light emitting diode OLED.

A gate of the switching thin film transistor T2 may be connected to the gate line 121a, and a source of the switching thin film transistor T2 may be connected to the data line 171a. A drain of the switching thin film transistor T2 may be connected to the power line 172a via the operation control thin film transistor T5 while being connected to the source S of the driving thin film transistor T1.

The switching thin film transistor T2 may be turned on according to the gate signal GW[i] transmitted through the gate line 121a to transmit the data signal DATA[j] transmitted from the data line 171a to the source S of the driving thin film transistor T1, through the switching operation thereof.

The compensation thin film transistor T3 may be formed as double-gate transistors T3-1 and T3-2 to prevent current leakage. Gates of the compensation thin film transistors T3-1 and T3-2 may be connected to the gate line 121a, and a source of the compensation thin film transistor T3-2 may be connected to the anode of the organic light emitting diode OLED via the light emission control thin film transistor T6 while being connected to the drain D of the driving thin film transistor T1. A drain of the compensation thin film transistor T3-1 may be connected to one end of the storage capacitor CST, a drain of the initialization thin film transistor T4, and the gate G of the driving thin film transistor T1. Further, a drain of the compensation thin film transistor T3-2 and a source of the compensation thin film transistor T3-1 may be connected to each other. The compensation thin film transistor T3 may be turned on according to the gate signal GW[i] transmitted through the gate line 121a to connect the gate G and the drain D of the driving thin film transistor T1 to each other, such that the driving thin film transistor T1 may be operated as a diode.

The initialization thin film transistor T4 may be formed as double-gate transistors T4-1 and T4-2, thereby preventing current leakage. A gate of the initialization thin film transistor T4-1 may be connected to the initialization line 122a, and a drain of the initialization thin film transistor T4-1 may be connected to a source of the initialization thin film transistor T4-2. A source of the initialization thin film transistor T4-1 may be connected to one end of the storage capacitor CST, the drain of the compensation thin film transistor T3-1, and the gate G of the driving thin film transistor T1.

A gate of the initialization thin film transistor T4-2 may be connected to the initialization line 122a, and a drain of the initialization thin film transistor T4-2 may be connected to the initialization voltage line 150a. A source of the initialization thin film transistor T4-2 may be connected to the drain of the initialization thin film transistor T4-1.

The initialization thin film transistor T4 may be turned on according to the initialization signal GI[i] transmitted through the initialization line 122a to transmit the initialization voltage VINT to the gate G of the driving thin film transistor T1 such that a voltage of the gate G of the driving thin film transistor T1 may be initialized.

A gate of the operation control thin film transistor T5 may be connected to the light emission control line 123a, and a source of the operation control thin film transistor T5 may be connected to the power line 172a. A drain of the operation control thin film transistor T5 may be connected to the source S of the driving thin film transistor T1 and the drain of the switching thin film transistor T2.

A gate of the light emission control thin film transistor T6 may be connected to the light emission control line 123a, and a source of the light emission control thin film transistor T6 may be connected to the drain D of the driving thin film transistor T1 and the source of the compensation thin film transistor T3. A drain of the light emission control thin film transistor T6 may be electrically connected to the anode of the organic light emitting diode OLED and a source of the bypass thin film transistor T7.

The operation control thin film transistor T5 and the light emission control thin film transistor T6 may be substantially simultaneously (or concurrently) turned on according to the light emission control signal EM[i] transmitted through the light emission control line 123a, and thus the first driving voltage ELVDD may be transmitted to the organic light emitting diode OLED for the driving current Id to flow through the organic light emitting diode OLED.

A gate of the bypass thin film transistor T7 may be connected to an (i+1)-th row initialization line 122b, and a drain of the bypass thin film transistor T7 may be connected to an (i+1)-th row initialization voltage line 150b. A source of the bypass thin film transistor T7 may be electrically connected to the anode of the organic light emitting diode OLED and the drain of the light emission control thin film transistor T6.

The bypass thin film transistor T7 may be turned on according to the initialization signal GI[i+1] transmitted through the (i+1)-th initialization line 122b to initialize an anode voltage of the organic light emitting diode OLED with the initialization voltage VINT.

The other end of the storage capacitor CST may be connected to the power line 172a, and a cathode of the organic light emitting diode OLED may receive the second driving voltage ELVSS. Accordingly, the organic light emitting diode OLED may receive the driving current Id from the driving thin film transistor T1 and then may emit light to display an image.

A structure of the pixel of the organic light emitting display device illustrated in FIG. 2 will be described in detail with reference to FIG. 3 along with FIG. 2.

Figure 3:
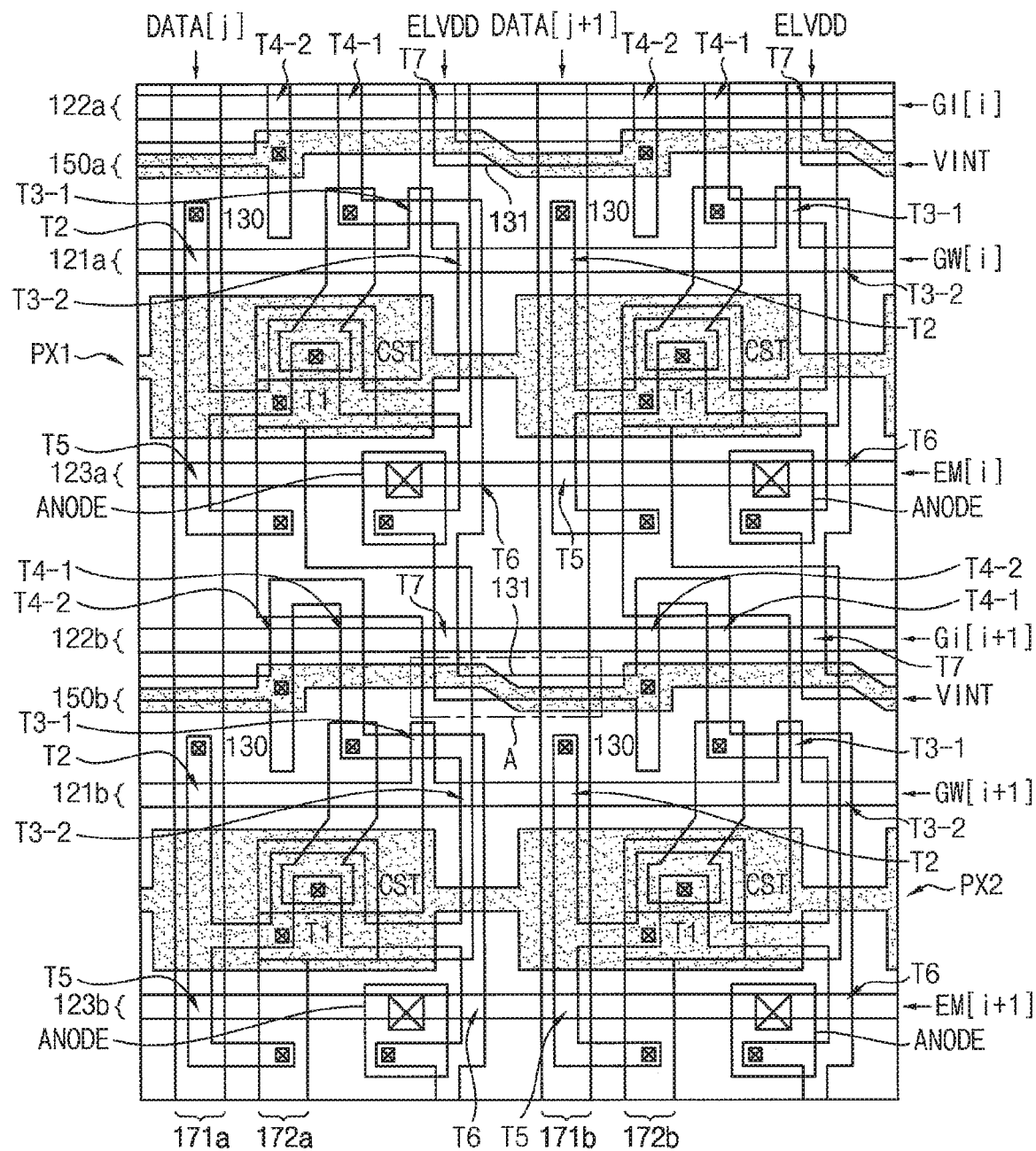
FIG. 3 is a diagram illustrating an exemplary embodiment of a plurality of thin film transistors and a capacitor of a display substrate that may be used in the organic light emitting display device shown in FIG. 1.
Figure 3:
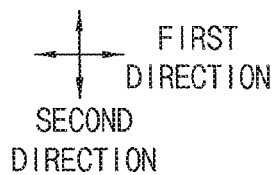

FIG. 3 is a diagram illustrating an exemplary embodiment of a plurality of thin film transistors and a capacitor of a display substrate that may be used in the organic light emitting display device shown in FIG. 1.

Referring to FIG. 3, a display substrate according to an exemplary embodiment may include the gate lines 121a and 121b, the initialization lines 122a and 122b, and the light emission control lines 123a and 123b, which respectively apply the gate signals GW[i] and GW[i+1], the initialization signals GI[i] and GI[i+1], and the light emission control signals EM[i] and EM[i+1], and which are formed along the first direction. Further, the display substrate may include the initialization voltage lines 150a and 150b that apply the initialization voltage VINT. The organic light emitting display device described with reference to FIGS. 1 and 2 may include the display substrate illustrated in FIG. 3.

The display substrate may include the data lines 171a and 171b and the power lines 172a and 172b, which respectively apply the data signals DATA[j] and DATA[j+1], and the first driving voltage ELVDD to the pixels PX, and which intersect all of the gate lines 121a and 121b, the initialization lines 122a and 122b, and the light emission control lines 123a and 123b.

The driving thin film transistor T1, the switching thin film transistor T2, the compensation thin film transistor T3, the initialization thin film transistor T4, the operation control thin film transistor T5, the light emission control thin film transistor T6, the bypass thin film transistor T7, and the storage capacitor CST may be formed in each of the pixels PX.

The thin film transistors T1, T2, T3, T4, T5, T6, and T7 may be at least one of an amorphous silicon thin film transistor (amorphous-Si TFT), a low temperature polysilicon (LTPS) thin film transistor, or an oxide thin film transistor (Oxide TFT). The oxide thin film transistor may include an oxide semiconductor layer formed of amorphous indium-gallium-zinc-oxide (IGZO), zinc-oxide (ZnO), titanium oxide (TiO), or the like as an active pattern 130.

The driving thin film transistor T1, the switching thin film transistor T2, the compensation thin film transistor T3, the initialization thin film transistor T4, the operation control thin film transistor T5, the light emission control thin film transistor T6, and the bypass thin film transistor T7 may be formed along the active pattern 130, and the active pattern 130 may be formed to be bent into various shapes.

The active pattern 130 may include an active line 131 extending along the first direction. In an exemplary embodiment, the active line 131 may be located between the active pattern 130 of the bypass thin film transistor T7 of a pixel located in an i-th row and the active pattern 130 of the initialization thin film transistor T4 of a pixel located in an (i+1)-th row. In an exemplary embodiment, the active line 131 may be located between the active pattern 130 of the bypass thin film transistor T7 of a pixel located in a j-th column and the active pattern 130 of the initialization thin film transistor T4 of a pixel located in a (j+1)-th row. For example, the active line 131 may be located between the active pattern 130 of the bypass thin film transistor T7 of the first pixel PX1 located in the i-th row and the j-th column and the active pattern 130 of the initialization thin film transistor T4 of the second pixel PX2 located in the (i+1)-th row and the (j+1)-th column.

The initialization voltage lines 150a and 150b may be disposed on the active line 131 while being insulated thereto. The initialization voltage lines 150a and 150b may partially overlap the active line 131.

Hereinafter, structures of the active line 131 and the initialization voltage line 150b of the display substrate according to an exemplary embodiment will be described in detail with reference to FIGS. 4 and 5.

Figure 4:
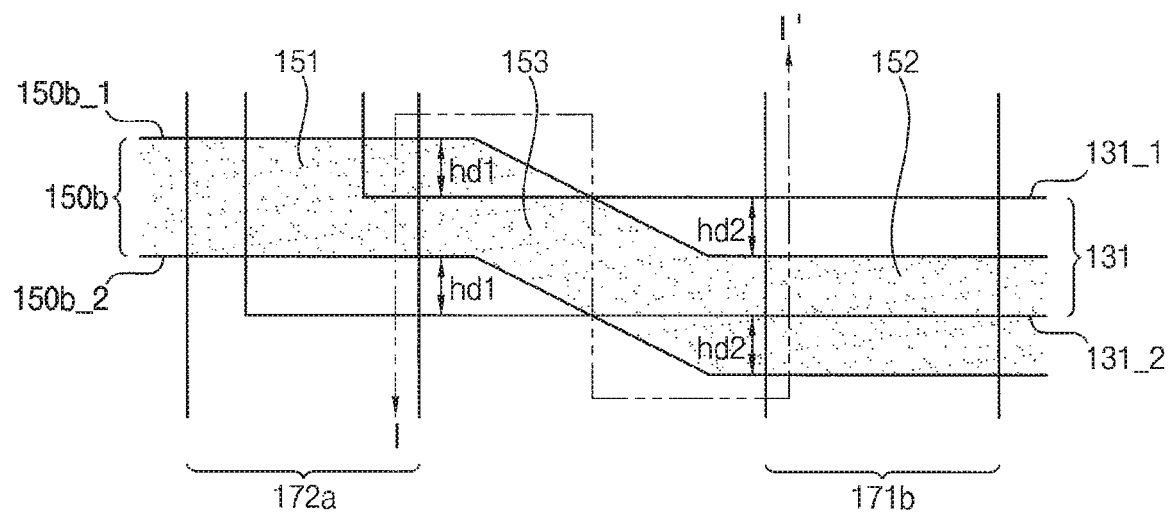
FIG. 4 is a diagram illustrating an exemplary embodiment of conductive lines of the display substrate device shown in FIG. 3.
Figure 4:
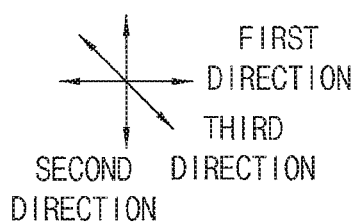

FIG. 4 is a diagram illustrating an exemplary embodiment of conductive lines of the display substrate device shown in FIG. 3. For example, FIG. 4 illustrates an enlarged area A in FIG. 3. FIG. 5 is a cross-sectional view of the display substrate in FIG. 4 taken along a line I-I' of FIG. 4.

Figure 5:
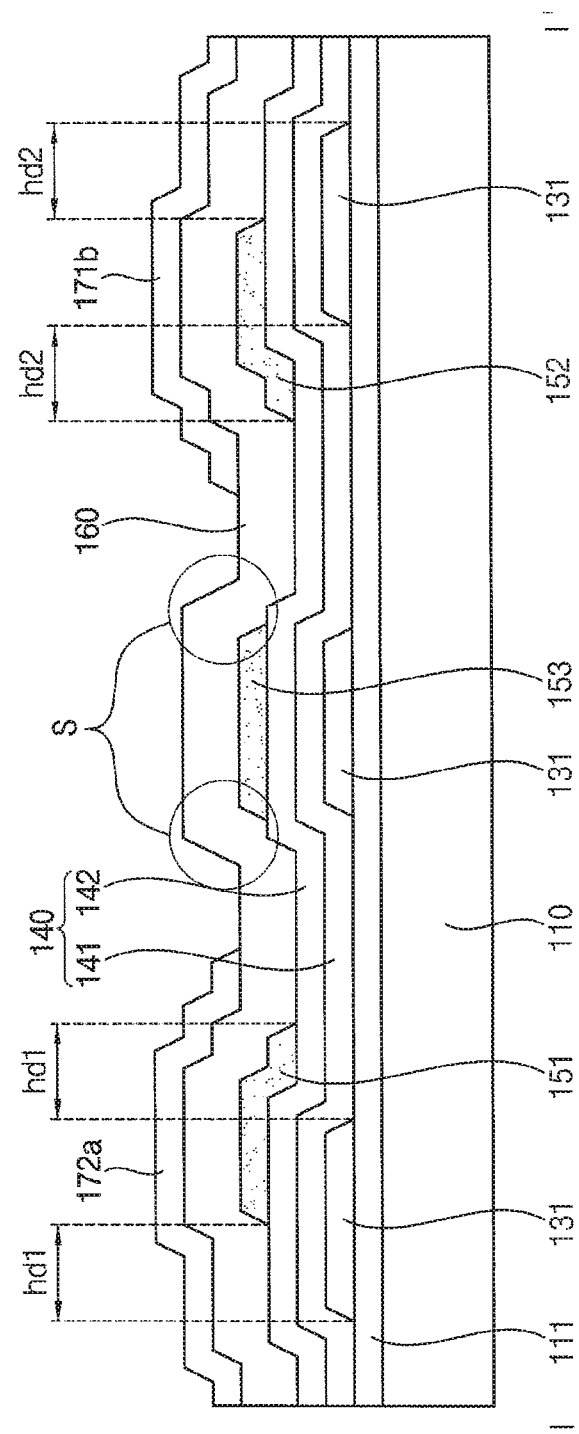
FIG. 5 is a cross-sectional view of the display substrate in FIG. 4 taken along line I-I' of FIG. 4.

Referring to FIGS. 4 and 5, a buffer layer 111 may be disposed on a substrate 110. The substrate 110 may be formed as an insulation substrate that is made of glass, quartz, ceramic, plastic, or the like.

A first conductive line may be disposed on the buffer layer 111. The first conductive line may correspond to the active line 131 in FIG. 3. The first conductive line is not limited to the active line 131. However, for explanatory purposes only, the description hereinafter will be made based on an assumption that the first conductive line is the active line 131. The active line 131 may extend along the first direction, and may include a first side surface 131_1 and a second side surface 131_2 disposed opposite to each other.

A first insulation layer covering the active line 131 may be disposed on the buffer layer 111. The first insulation layer may correspond to a gate insulation layer 140. The first insulation layer is not limited to the gate insulation layer 140. However, for explanatory purposes only, the description hereinafter will be made based on an assumption that the first insulation layer is the gate insulation layer 140. The gate insulation layer 140 may include a first gate insulation layer 141 disposed on the buffer layer 111 and covering the active line 131, and a second gate insulation layer 142 disposed on the first gate insulation layer 141.

The gate lines 121a and 121b, the initialization lines 122a and 122b, and light emission control lines 123a and 123b illustrated in FIG. 3 may be disposed on the first gate insulation layer 141. Further, one end of the storage capacitor CST and an electrode acting as the gate of the driving thin film transistor T1 may be disposed on the first gate insulation layer 141.

The second gate insulation layer 142 covering the gate lines 121a and 121b, the initialization lines 122a and 122b, and light emission control lines 123a and 123b may be disposed on the first gate insulation layer 141. A second conductive line may be disposed on the second gate insulation layer 142. The second conductive line may correspond to the initialization voltage lines 150a and 150b in FIG. 3. The second conductive line is not limited to the initialization voltage lines 150a and 150b. However, for explanatory purposes only, the description hereinafter will be made based on an assumption that the second conductive line is one of the initialization voltage lines 150a and 150b. Further, an electrode acting as the other end of the storage capacitor CST may be disposed on the second gate insulation layer 142.

A second insulation layer covering the initialization voltage lines 150a and 150b may be disposed on the second gate insulation layer 142. The second insulation layer may correspond to an insulation interlayer 160. The second insulation layer is not limited to the insulation interlayer 160. However, for explanatory purposes only, the description hereinafter will be made based on an assumption that the second insulation layer is the insulation interlayer 160. A third conductive line and a fourth conductive line may be disposed on the insulation interlayer 160. The third conductive line and the fourth conductive line may correspond to the data lines 171a and 171b and the power lines 172a and 172b in FIG. 3, respectively. The third conductive line and the fourth conductive line are not limited to the data lines 171*a* and 171*b* and the power lines 172*a* and 172*b*, respectively. However, for explanatory purposes only, the description hereinafter will be made based on an assumption that the third conductive line and the fourth conductive line are the data lines 171*a* and 171*b* and the power lines 172*a* and 172*b*, respectively. The data lines 171*a* and 171*b* and the power lines 172*a* and 172*b* may intersect the initialization voltage lines 150*a* and 150*b* with the insulation interlayer 160 disposed in between. For example, the data lines 171*a* and 171*b* and the power lines 172*a* and 172*b* may extend along the second direction.

As illustrated in FIG. 4, the initialization voltage line 150*b* may include portions overlapped with the active line 131. In the portions overlapped with the active line 131, the initialization voltage line 150*b* may include substantially linear portions, such as a first straight portion 151 and a second straight portion 152 which extend along the first direction, and an angled portion, such as diagonal portion 153, disposed between the first straight portion 151 and the second straight portion 152. At least one side surface of the diagonal portion 153 may extend along a third direction. The third direction may be a direction between the first direction and the second direction which intersects the first and second directions. For example, the third direction may make an acute angle with the first direction in a clockwise direction. The initialization voltage line 150*b* may include a first side surface 150*b*_1 and a second side surface 150*b*_2 opposite to each other. Accordingly, at least one of the first side surface 150*b*_1 and the second side surface 150*b*_2 of the diagonal portion 153 may extend along the third direction. Further, all of the first side surface 150*b*_1 and the second side surface 150*b*_2 of the first straight portion 151 and the first side surface 150*b*_1 and the second side surface 150*b*_2 of the second straight portion 152 may extend along the first direction.

In an exemplary embodiment, the diagonal portion 153 of the initialization voltage line 150*b* may be located between the data line 171*a* and 171*b* and the power line 172*a* and 172*b*. For example, the diagonal portion 153 of the initialization voltage line 150*b* may be located between a j-th column power line 172*a* and a (j+1)-th column data line 171*b*. In this case, the first straight portion 151 of the initialization voltage line 150*b* may intersect the j-th column power line 172*a*, and the second straight portion 152 of the initialization voltage line 150*b* may intersect the (j+1)-th column data line 171*b*.

As shown in the plan view of FIG. 4, at least one side surface of the diagonal portion 153 of the initialization voltage line 150*b* may extend in a direction intersecting the direction of a side surface of the active line 131. At least one of the first side surface 150*b* 1 and the second side surface 150*b*_2 of the diagonal portion 153 of the initialization voltage line 150*b* may extend in a direction intersecting the direction of any one of the first side surface 131_1 and the second side surface 131_2 of the active line 131. In an exemplary embodiment, the first side surface 150*b*_1 of the diagonal portion 153 of the initialization voltage line 150*b* may extend in a direction intersecting the direction of the first side surface 131_1 of the active line 131, and the second side surface 150*b*_2 of the diagonal portion 153 of the initialization voltage line 150*b* may extend in a direction intersecting the direction of the second side surface 131_2 of the active line 131.

In an exemplary embodiment, opposing side surfaces 150*b*1 and 150*b*_2 of the diagonal portion 153 of the initialization voltage line 150*b* may extend along the third direction. In this case, a part of the first straight portion 151 of the initialization voltage line 150*b* may overlap the active line 131, and a part of the second straight portion 152 of the initialization voltage line 150*b* may overlap the active line 131. For example, as illustrated in FIG. 4, a part of the first straight portion 151 of the initialization voltage line 150*b* adjacent to the second side surface 150*b*_2 may overlap a part of the active line 131 adjacent to the first side surface 131_1, and a part of the second straight portion 152 of the initialization voltage line 150*b* adjacent to the first side surface 150*b*_1 may overlap a part of the active line 131 adjacent to the second side surface 131_2. In an exemplary embodiment, the first side surface 150*b*_1 and the second side surface 150*b*_2 of the diagonal portion 153 of the initialization voltage line 150*b* may be parallel to each other.

A first horizontal distance hd1 extending between respective side surfaces of the active line 131 and the first straight portion 151 of the initialization voltage line 150*b* or a second horizontal distance hd2 extending between respective side surfaces of the active line 131 and the second straight portion 152 of the initialization voltage line 150*b* may be greater than a predetermined distance. The first horizontal distance hd1 may be a horizontal distance between the first side surface 131_1 of the active line 131 and the first side surface 150*b* 1 of the first straight portion 151 of the initialization voltage line 150*b* or a horizontal distance between the second side surface 131_2 of the active line 131 and the second side surface 150*b* 2 of the first straight portion 151 of the initialization voltage line 150*b*. Further, the second horizontal distance hd2 may be a horizontal distance between the first side surface 131_1 of the active line 131 and the first side surface 150*b*_1 of the second straight portion 152 of the initialization voltage line 150*b* or a horizontal distance between the second side surface 131_2 of the active line 131 and the second side surface 150*b*_2 of the second straight portion 152 of the initialization voltage line 150*b*. Here, the horizontal distance may be a distance between respective side surfaces of the active line 131 and initialization voltage line 150*b* assuming that the active line 131 and the initialization voltage line 150*b* are located in the same planar surface. In an exemplary embodiment, the first horizontal distance hd1 or the second horizontal distance hd2 may be greater than about 0.45 μm. In an exemplary embodiment, the first horizontal distance hd1 or the second horizontal distance hd2 may be greater than about 1.48 μm in consideration of the process margin.

In an exemplary embodiment, the first horizontal distance hd1 and the second horizontal distance hd2 may be greater than about 0.45 μm as illustrated in FIG. 4. When the horizontal distance between respective side surfaces of the active line 131 and the initialization voltage line 150*b* is less than about 0.45 μm, a relatively large and deep step portion in the regions indicated with S in FIG. 5 may be formed on the insulation interlayer 160 where it overlaps section 153 of the initialization voltage line 150*b*, and an unwanted residual conductive layer may be formed on the insulation interlayer 160 during the etching process that removes material to form data and power lines 172*a* and 171*b*, due to the depth of the large step portion at S. When the residual conductive layer is formed along the first direction, the data line 171*b* and the power line 172*a* may be shorted by the residual conductive layer.

When the first horizontal distance hd1 and the second horizontal distance hd2 are greater than about 0.45 μm like as the above-described exemplary embodiment, a relatively small step portion may be formed in the insulation interlayer 160 covering the initialization voltage line 150*b*, and the unwanted residual conductive layer may not be formed on the insulation interlayer 160. In an exemplary embodiment, the first horizontal distance hd1 and the second horizontal distance hd2 may be greater than about 1.48 µm.

Figure 6:
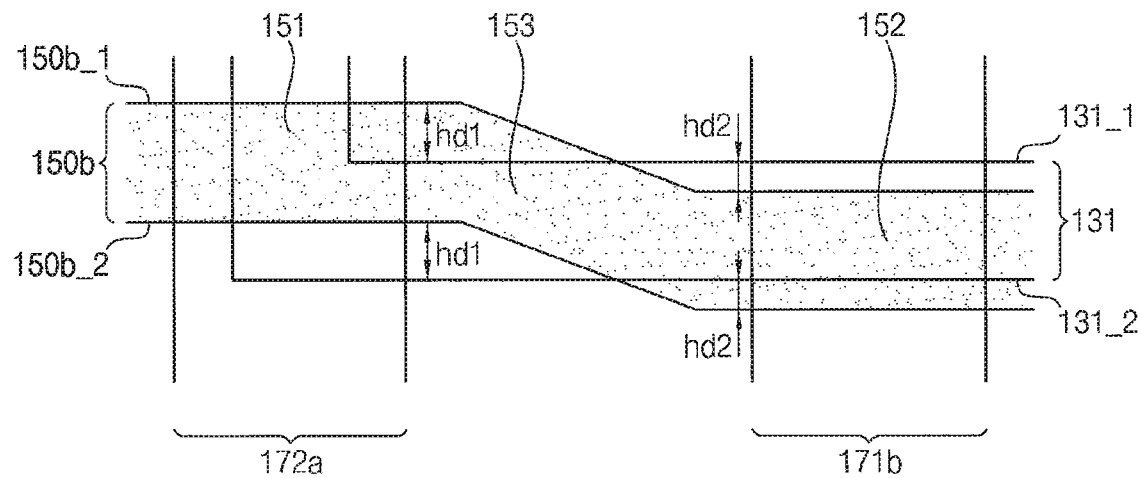
FIG. 6 is a diagram illustrating conductive lines of a display substrate according to another exemplary embodiment.
Figure 6:
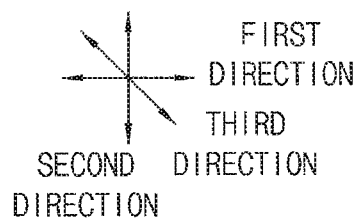

FIG. 6 is a diagram illustrating conductive lines of a display substrate according to another exemplary embodiment.

In an exemplary embodiment, one of the first horizontal distance hd1 and the second horizontal distance hd2 may be greater than about 0.45 µm, and the other may be less than about 0.45 µm. For example, the first horizontal distance hd1 may be greater than about 0.45 µm, and the second horizontal distance hd2 may be less than about 0.45 µm as illustrated in FIG. 6. When a horizontal distance between a respective side surfaces of the active line 131 and the initialization voltage line 150b is less than about 0.45 µm, a relatively large step portion may be formed in the insulation interlayer 160 covering the initialization voltage line 150b according to the active line 131 and the initialization voltage line 150b, which are overlapped, and an unwanted residual conductive layer may be formed on the insulation interlayer 160 due to the large step portion. When the residual conductive layer is formed along the first direction, the data line 171b and the power line 172a may be connected by the residual conductive layer.

When the first horizontal distance hd1 is greater than about 0.45 and the second horizontal distance hd2 is less than about 0.45 µm like as the above-described exemplary embodiment, an unwanted residual conductive layer may be formed at a portion on the insulation interlayer 160 adjacent to the data line 171b, however, the unwanted residual conductive layer may not be formed at a portion on the insulation interlayer 160 adjacent to the power line 172a. Therefore, the data line 171b and the power line 172a may not be connected to each other. In an exemplary embodiment, one of the first horizontal distance hd1 and the second horizontal distance hd2 may be greater than about 1.48 µm, and the other may be less than about 1.48 µm in consideration of the process margin.

Figure 7:
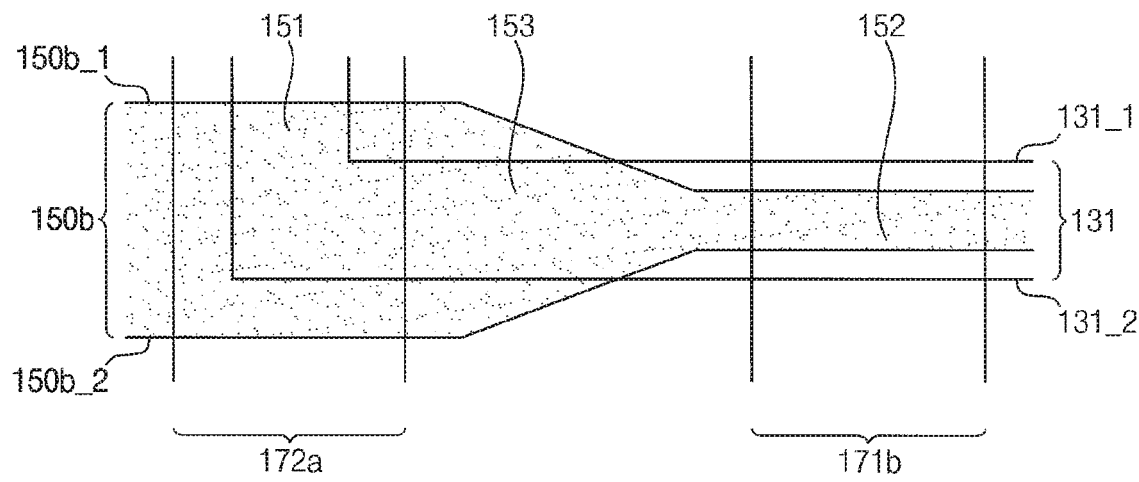
FIG. 7 is a diagram illustrating conductive lines of a display substrate according to yet another exemplary embodiment.
Figure 7:
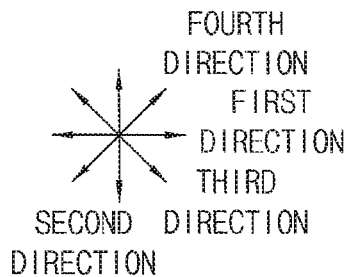

FIG. 7 is a diagram illustrating conductive lines of a display substrate according to yet another exemplary embodiment.

Referring to FIG. 7, in an exemplary embodiment, one of the opposing side surfaces of the diagonal portion 153 of the initialization voltage line 150b may extend along the third direction, and another of the opposing side surfaces of the diagonal portion 153 may extend along a fourth direction. The fourth direction may be a direction between the first direction and the second direction which intersect each other, and may intersect the third direction. For example, the fourth direction may make an acute angle with the first direction in a counter clockwise direction. In this case, a part of the first straight portion 151 of the initialization voltage line 150b may overlap the active line 131, and an entirety of the second straight portion 152 of the initialization voltage line 150b may overlap the active line 131. For example, as illustrated in FIG. 7, parts of the first straight portion 151 of the initialization voltage line 150b respectively adjacent to the first side surface 150b_1 and the second side surface 150b_2 may not overlap the active line 131, and parts of the second straight portion 152 of the initialization voltage line 150b respectively adjacent to the first side surface 150b_1 and the second side surface 150b_2 may overlap the active line 131. In an exemplary embodiment, the first side surface 150b_1 and the second side surface 150b_2 of the diagonal portion 153 of the initialization voltage line 150b may be symmetrical with respect to the first direction.

Figure 8:
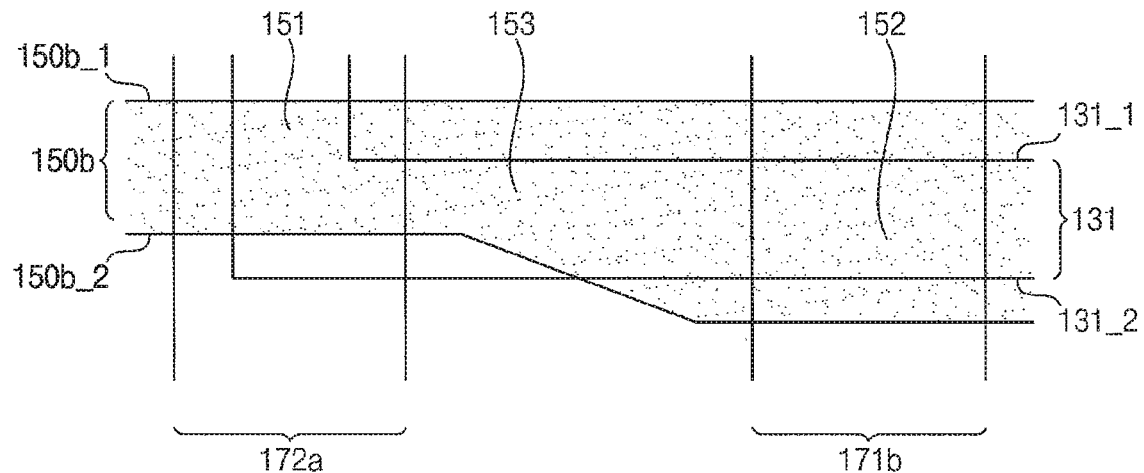
FIG. 8 is a diagram illustrating conductive lines of a display substrate according to still another exemplary embodiment.
Figure 9:
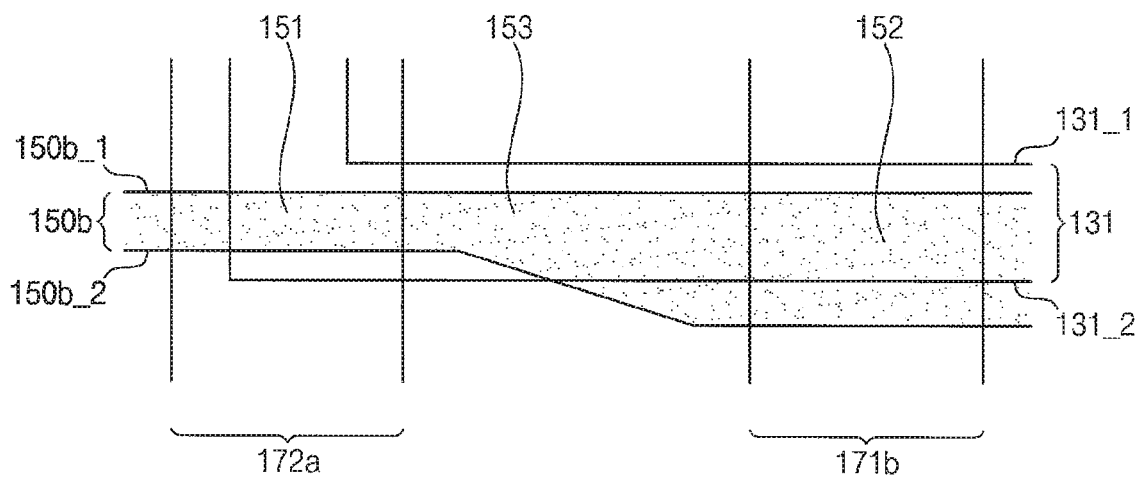
FIG. 9 is a diagram illustrating conductive lines of a display substrate according to yet still another exemplary embodiment.

FIG. 8 is a diagram illustrating conductive lines of a display substrate according to still another exemplary embodiment. FIG. 9 is a diagram illustrating conductive lines of a display substrate according to yet still another exemplary embodiment.

Referring to FIGS. 8 and 9, one of the opposing side surfaces of the diagonal portion 153 of the initialization voltage line 150b may extend along the third direction, and another of the opposing side surfaces of the diagonal portion 153 may extend along the first direction. In this case, one of the opposing side surfaces 150b_1 and 150b_2 of the initialization voltage line 150b may extend along the first direction. For example, the first side surface 150b_1 of the initialization voltage line 150b may extend along the first direction as illustrated in FIG. 8.

In an exemplary embodiment, a part of the initialization voltage line 150b adjacent to a side surface extending along the first direction may not overlap the active line 131. For example, a part of the initialization voltage line 150b adjacent to the first side surface 150b_1 extending along the first direction may not overlap the active line 131 as illustrated in FIG. 8.

In an exemplary embodiment, a part of the initialization voltage line 150b adjacent to a side surface extending along the first direction may overlap the active line 131. For example, a part of the initialization voltage line 150b adjacent to the first side surface 150b_1 extending along the first direction may overlap the active line 131 as illustrated in FIG. 9.

Organic light emitting display device constructed according to principles and exemplary embodiments of the invention may be applied to display devices included in a computer, a notebook, a mobile phone, a smartphone, a smart pad, a PMP, a PDA, an MP3 player, or the like. Moreover, the principles of the invention may be applied to and used in the display substrates of other types of display devices beside organic light emitting display devices.

Some of the advantages that may be achieved by exemplary embodiments of the invention include reducing the formation of a residual conductive layer during an etching process of a substrate, and reducing a residual conductive layer between a data line and a power line of an organic light emitting display device, during an etching process for forming such data line and the power line.

Although certain exemplary embodiments and implementations have been described herein, other exemplary embodiments and modifications will be apparent from this description. Accordingly, the inventive concepts are not limited to such exemplary embodiments, but rather to the broader scope of the appended claims and various obvious modifications and equivalent arrangements as would be apparent to a person of ordinary skill in the art.

What is claimed is:

1. A display substrate, comprising:
a first conductive line extending along a first direction; and
a second conductive line partially overlapping the first conductive line with a first insulation layer in between,
wherein the second conductive line includes:
a first substantially linear portion and a second substantially linear portion extending along the first direction; and
an angled portion disposed between the first substantially linear portion and the second substantially linear portion, the angled portion having at least one side surface extending along a second direction intersecting the first direction, wherein the first and second conductive lines each have side surfaces, and a first horizontal distance between a side surface of the first conductive line and a side surface of the first substantially linear portion of the second conductive line is greater than about 0.45 μm.

2. The display substrate of claim 1, wherein the at least one side surface of the angled portion intersects a side surface of the first conductive line.

3. The display substrate of claim 1, wherein the angled portion has opposing side surfaces extending along the second direction.

4. The display substrate of claim 1, wherein the angled portion has opposing side surfaces, with one of the opposing side surfaces of the angled portion extending along the second direction, and
another of the opposing side surfaces of the angled portion extending along a third direction different from the first and second directions.

5. The display substrate of claim 1, wherein the angled portion has opposing side surfaces, with one of the opposing side surfaces of the angled portion extending along the second direction, and
another of the opposing side surfaces of the angled portion extending along the first direction.

6. The display substrate of claim 1, wherein the first horizontal distance is greater than about 1.48 μm.

7. The display substrate of claim 1, wherein a second horizontal distance between a side surface of the first conductive line and a side surface of the second substantially linear portion of the second conductive line is greater than about 0.45 μm.

8. The display substrate of claim 7, wherein the second horizontal distance is greater than about 1.48 μm.

9. The display substrate of claim 1, further comprising a third conductive line and a fourth conductive line each intersecting the second conductive line with a second insulation layer in between,
wherein the angled portion of the second conductive line is disposed between the third conductive line and the fourth conductive line.

10. An organic light emitting display device, comprising:
a display substrate, comprising:
an active pattern comprising an active line extending along a first direction;
a signal line comprising an initialization voltage line partially overlapping the active line with a gate insulation layer in between, a gate line and an initialization line extending along the first direction, and a data line and a power line extending along a second direction intersecting the first direction; and
a plurality of pixels each connected to the signal line, the plurality of pixels each comprising a plurality of thin film transistors formed along the active pattern, a capacitor connected to the power line, and an organic light emitting diode,
wherein the initialization voltage line partially overlapping the active line with a first insulation layer in between includes:
a first substantially linear portion and a second substantially linear portion separate from the first substantially linear portion, each of which extends extending-along the first direction; and
an angled portion disposed between and connecting the first substantially linear portion and the second substantially linear portion, the angled portion having at least one side surface extending along a third direction different from and intersecting the first and second directions;
wherein each of the active and initialization voltage lines has side surfaces, and a first horizontal distance between a side surface of the active line and a side surface of the first substantially linear portion of the initialization voltage line is greater than about 0.45 μm.

11. The organic light emitting display device of claim 10, wherein the at least one side surface of the angled portion intersects a side surface of the active line.

12. The organic light emitting display device of claim 10, wherein the angled portion has opposing side surfaces extending along the third direction.

13. The organic light emitting display device of claim 10, wherein the angled portion has opposing side surfaces, with one of the opposing side surfaces of the angled portion extending along the third direction, and another of the opposing side surfaces extending along a fourth direction.

14. The organic light emitting display device of claim 10, wherein the angled portion has opposing side surfaces, with one of the opposing side surfaces extending along the third direction, and
another of the opposing side surfaces extending along the first direction.

15. The organic light emitting display device of claim 10, wherein each of the plurality of pixels comprises a switching thin film transistor connected to the gate line and the data line, a driving thin film transistor connected to a drain of the switching thin film transistor, an initialization thin film transistor turned on by an initialization signal transmitted through the initialization line to apply an initialization voltage transmitted through the initialization voltage line, and a bypass thin film transistor connected to an anode of the organic light emitting diode, and
wherein the active line is between the bypass thin film transistor of a pixel in an i-th row and the initialization thin film transistor of a pixel in an (i+1)-th row, wherein i is a natural number.

16. The organic light emitting display device of claim 15, wherein the active line is between the bypass thin film transistor of a pixel in a j-th column and the initialization thin film transistor of a pixel in a (j+1)-th column, wherein j is a natural number.

17. The organic light emitting display device of claim 10, wherein the data line and the power line intersect the initialization voltage line, respectively, with an insulation interlayer in between, and
wherein the angled portion of the initialization voltage line is between the data line and the power line.

18. The organic light emitting display device of claim 17, wherein each of the plurality of pixels comprises a switching thin film transistor connected to the gate line and the data line,
wherein the power line is connected to the capacitor of a pixel in a j-th column, and
wherein the data line is connected to the switching thin film transistor of a pixel in a (+1)-th column, wherein j is a natural number.

19. The organic light emitting display device of claim 10, wherein the gate insulation layer comprises a first gate insulation layer and a second gate insulation layer,
wherein the gate line and the initialization line are on the active pattern with the first gate insulation layer in between, and wherein the initialization voltage line is on the gate line and the initialization line with the second gate insulation layer in between.

\* \* \* \* \*